United States Patent
Checchetti

(10) Patent No.: US 6,196,300 B1
(45) Date of Patent: Mar. 6, 2001

(54) HEAT SINK

(76) Inventor: Maurizio Checchetti, P.zzáSicilia, 1,I-20146, Milano (IT)

( * ) Notice: Subject to any disclaimer, the term of this patent is extended or adjusted under 35 U.S.C. 154(b) by 0 days.

(21) Appl. No.: 09/446,877

(22) PCT Filed: Jul. 27, 1998

(86) PCT No.: PCT/IT98/00211

§ 371 Date: Apr. 18, 2000

§ 102(e) Date: Apr. 18, 2000

(87) PCT Pub. No.: WO99/07196

PCT Pub. Date: Feb. 11, 1999

(30) Foreign Application Priority Data

Jul. 31, 1997 (IT) .............................................. MI97A1842

(51) Int. Cl.⁷ .................................................. H05K 7/20
(52) U.S. Cl. ...................... 165/80.3; 165/121; 174/16.3; 361/697; 415/178
(58) Field of Search .................................. 165/121, 80.3, 165/185; 361/697; 174/16.3; 415/178

(56) References Cited

U.S. PATENT DOCUMENTS

| | | |
|---|---|---|
| 3,592,260 | 7/1971 | Berger . |
| 3,866,668 | 2/1975 | Doerner . |
| 4,715,438 | 12/1987 | Gabuzda et al. ...................... 165/185 |
| 4,733,293 * | 3/1988 | Gabuzda .......................... 165/80.3 X |
| 4,823,869 | 4/1989 | Arnold et al. ........................ 165/185 |
| 5,132,780 | 7/1992 | Higgins, III .......................... 257/722 |
| 5,195,576 | 3/1993 | Hatada et al. . |
| 5,335,722 | 8/1994 | Wu . |
| 5,353,863 | 10/1994 | Yu . |
| 5,437,327 | 8/1995 | Chiou ................................... 165/122 |
| 5,452,181 | 9/1995 | Hoover . |
| 5,597,034 | 1/1997 | Barker, III et al. .................. 165/80.3 |
| 5,629,834 * | 5/1997 | Kodama et al. ................ 165/80.3 X |
| 5,650,912 | 7/1997 | Katsui et al. . |
| 5,661,638 | 8/1997 | Mira ..................................... 361/697 |
| 5,785,116 | 7/1998 | Wagner . |
| 5,957,659 * | 9/1999 | Amou et al. .......................... 415/178 |

FOREIGN PATENT DOCUMENTS 0 614 330   9/1994  (EP) .
63-113460   7/1988  (JP) .

* cited by examiner

Primary Examiner—Leonard Leo
(74) Attorney, Agent, or Firm—Seidel Gonda Lavorgna & Monaco, PC

(57) ABSTRACT

A heat sink comprising a conductive plate (1) to be applied onto the surface to be cooled, the thickness of which gradually increases from the edges (4) towards a central portion (5) according to a curvilinear profile (6) having an upwardly turned concavity, so that an air flow hitting the plate is deflected towards its edges with a substantially horizontal outlet direction. The conductive plate (1) has preferably arranged thereon a plurality of cooling fins (7) extending in a substantially radial way from the central portion (5) to the edges (4) of the plate.

11 Claims, 2 Drawing Sheets

HEAT SINK

BACKGROUND OF THE INVENTION

The present invention relates to a heat sink, and in particular to a heat sink which may be used for cooling integrated circuits, laser devices, electric or other electronic devices.

Heat sinks are known to comprise a plate, generally made of aluminum and provided on the top with cooling fins or pins, which directly contacts the housing containing the integrated circuits, in order to increase the heat exchange between the housing and the outside environment, and thus reducing the temperature of the circuit junctions. Since in the last years the size and the power of the integrated circuits are increased in geometric progression, these known heat sinks are no longer capable of dissipating the heat generated by the new circuits. Therefore, new heat sinks have been designed comprising an axial cooling fan arranged above the fins in order to increase the heat exchange between the heat sink and the surrounding air.

In order to reduce the size of the heat sink and optimize its thermal efficiency, such a cooling fan is arranged straight above the cooling fins, wherefore the air flow generated by the fan perpendicularly hits the conductive plate, resulting in turbulence and pressure drops which greatly reduce the heat exchange and thus the heat sink efficiency. Furthermore, the central portion of these known heat sinks is more heated, but the air flow coming from the fan is here reduced. In fact, for space requirements, the fan motor is inserted into the hub of the bladed rotor generating the air flow, so that it tends to outwardly flow without affecting the column of air between the rotor hub and the plate.

In order to overcome such drawbacks, a fan could be used with a larger rotor and a more powerful motor, but this solution would result in a more bulky and noisy heat sink, with evident problems when used inside an electronic device.

BRIEF SUMMARY OF THE INVENTION

The object of the present invention is thus to provide a heat sink free from such drawbacks, i.e. a heat sink which is silent, small-sized and having a high heat exchange between the conductive plate and the surrounding air. Such an object is achieved by a heat sink having the main features specified in claim 1.

Thanks to the special upper profile of the conductive plate of the heat sink according to the present invention, the air flow hitting it in a substantially perpendicular direction is deflected towards its edges with a substantially horizontal outlet direction, resulting in an improvement of the heat sink aerodynamics. Moreover, the greater thickness at the centre of the conductive plate increases its thermal capacity and conductivity, so that the greater heat amount at the centre of the integrated circuit is homogeneously conveyed and spread throughout the upper surface of the heat sink. The increased thermal capacity of the conductive plate is also advantageous for allowing the absorption of possible sudden changes of heat, due to a sudden intensive use of the integrated circuit. Finally, since the central portion of the conductive plate is relatively thick, it is possible to provide a cavity wherein a safety thermal sensor may be conveniently housed.

Another advantage of the heat sink according to the present invention is the fact that the shape and the arrangement of the cooling fins help to improve the aerodynamics and accordingly the heat exchange of the heat sink. In fact, the conductive plate and the cooling fins form together a member which, by virtue of its structure, similar to a rotor for centrifiugal pumps, exploits at the best the air flow in order to obtain the cooling of the heat sink.

BRIEF DESCRIPTION OF THE SEVERAL VIEWS OF THE DRAWINGS

Further advantages and features of the heat sink according to the present invention will be evident to those skilled in the art from the following detailed description of some embodiments thereof, with reference to the attached drawings, wherein.

DETAILED DESCRIPTION OF THE INVENTION

Figure 1:
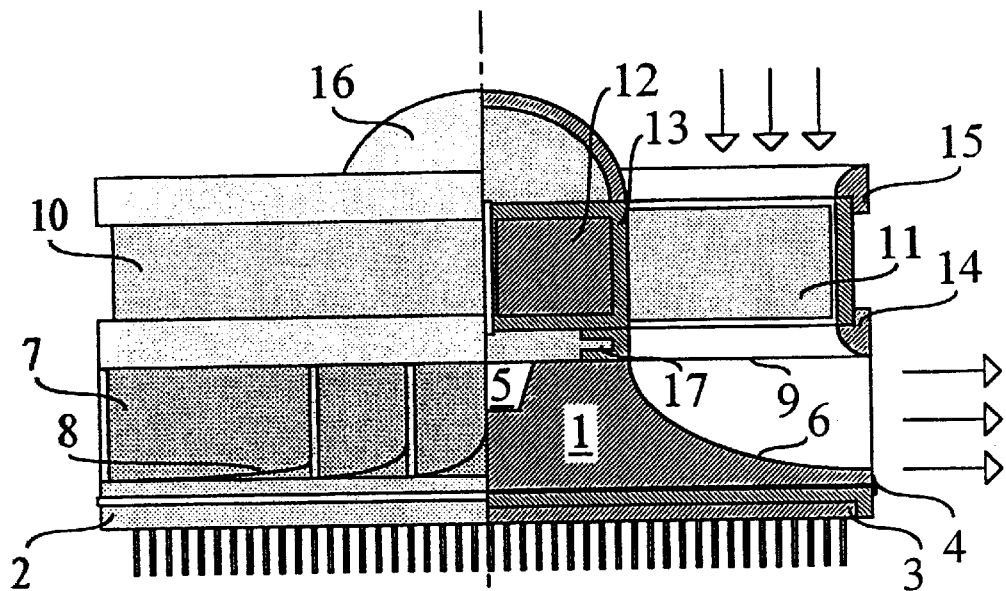
FIG. 1 shows a side view of the heat sink according to a first preferred embodiment of the present invention with a sectional view of its right half.

Referring to FIG. 1, the heat sink according to a first preferred embodiment of the present invention comprises a plate 1 fastened, e.g. through clamps (not shown in the Figure), on the upper surface of a housing 2 containing an integrated circuit 3. The thickness of plate 1 gradually increases, suitably from edges 4 to a central portion 5, which is preferably circular and hollow in order to allow the housing of a thermal sensor (not shown in the Figure), according to a curvilinear profile 6 having an upwardly turned concavity. By this arrangement an air flow (indicated by a set of arrows), hitting plate 1 in a substantially perpendicular direction, is deflected towards edges 4 a with a substantially horizontal outlet direction (indicated as well by a set of arrows). For this purpose, the tangents to such a curvilinear profile 6 are, in proximity of edges 4 and central portion 5, horizontal and vertical, respectively.

Figure 2:
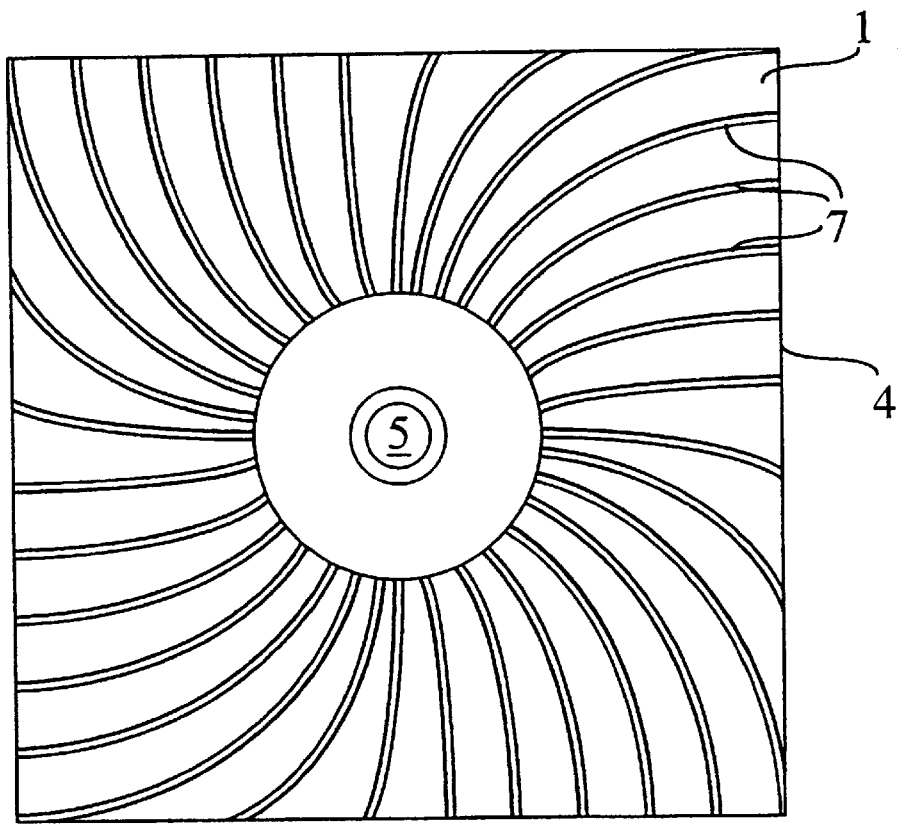
FIG. 2 shows a top view of the conductive plate of the heat sink of FIG. 1.

Referring now also to FIG. 2, plate 1 has provided thereon a plurality of cooling fins 7 extending in a substantially radial way from central portion 5 to plate edges 4 and being preferably curved with an outwardly increasing curvature radius. Junction edge 8 between cooling fins 7 and conductive plate 1, as well as upper leading edge 9 of the fins are preferably rounded in order to further improve the aerodynamics of the heat sink.

The air flow hitting the heat sink according to the present invention may be generated by external fans and conveyed on the conductive plate through air ducts, or, as in the present embodiment, may be generated by an axial fan 10 of a known type having its rotor, provided with blades 11, operated by a motor 12 inserted into a hub 13 of the rotor. Such a fan is suitably arranged above plate 1 with its axis perpendicular to the center of the latter. In order to improve the air flow continuity, the diameter of hub 13 is preferably equal to the diameter of central portion 5 of plate 1. In another embodiment of the heat sink according to the present invention a portion of hub 13 may obviously penetrate into the cavity of central portion 5 in order to reduce the bulk of the heat sink.

A diffuser joint 14, preferably made of an elastic material for absorbing the vibrations of motor 12, capable of conveying the air flow coming from the fan onto the whole upper surface of the plate is arranged between fan 10 and conductive plate 1. By virtue of joint 14, not only the heat sink aerodynamics is improved, but also blades 11 are prevented from being too close to fins 7 and accordingly causing a noxious "siren effect".

Finally, an air intake 15 is arranged above fan 10, which comprises a central dome 16 having a diameter substantially equal to the one of hub 13 and helping as well to improve the heat sink aerodynamics. An elastic ring 17 is inserted between hub 13 and central portion 5 in order to improve the air flow and absorb the vibrations of motor 12.

In order to manufacture conductive plate 1 of the heat sink according to the present invention, any known conductive material may be used, suitable for manufacturing heat sinks of a conventional type, such as e.g. aluminum.

Figure 3:
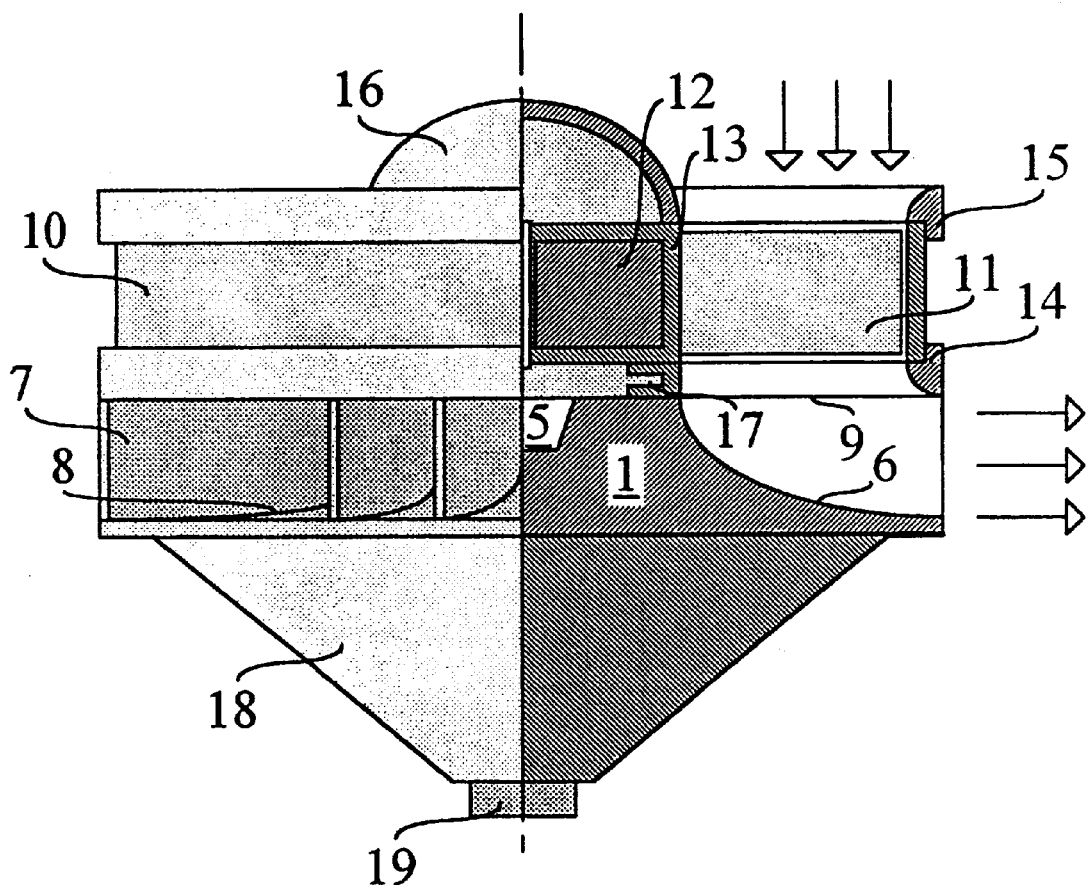
FIG. 3 shows a side view of the heat sink according to a second embodiment of the present invention with a sectional view of its right half.

In another embodiment, shown in FIG. 3, the lower portion of plate 1 may be provided with one or more heat anvils 18 for dissipating the heat generated by small devices, for instance laser diodes 19, which have an outer surface considerably smaller than the lower surface of plate 1.

Several conductive plates 1 may obviously be used for manufacturing a cooling device comprising one or more fans connected through an air duct to said plates.

What is claimed is:

1. A heat sink, comprising:
   a conductive plate for affixation to a coolable surface, the plate including at least one edge, a thickness of the plate gradually increasing according to a curvilinear profile having an upwardly turned concavity from the at least one edge to a central circular portion;
   a plurality of cooling fins affixed to and extending along the plate in a substantially radial manner from the central portion to the at least one edge;
   an axial fan positioned adjacent and above the cooling fins substantially coaxially with the central portion, the fan comprising a rotor having a hub of substantially the same diameter as the central portion and a plurality of blades extending radially from the hub that force air in an axial direction past a substantial portion of an edge of the fins adjacent to the blades.

2. A heat sink according to claim 1, wherein the tangent to said curvilinear profile in proximity to the at least one edge of the plate is substantially horizontal.

3. A heat sink according to claim 1, wherein the tangent to said curvilinear profile in proximity to the central portion of the plate is substantially vertical.

4. A heat sink according to claim 1, wherein the cooling fins are curved.

5. A heat sink according to claim 4, wherein the curvature radius of the cooling fins increases from the central portion to the at least one edge of the conductive plate.

6. A heat sink according to claim 1, wherein a junction edge between the cooling fins and the conductive plate is rounded.

7. A heat sink according to claim 1, wherein an edge of the fins adjacent to the blades of the axial fan is rounded.

8. A heat sink according to claim 1, wherein the conductive plate and the cooling fins are made of a single piece.

9. A heat sink according to claim 1, wherein a diffuser joint for conveying the air flow coming from the fan onto the upper surface of the conductive plate is arranged between the fan and the conductive plate.

10. A heat sink according to claim 1, further comprising an air intake including a central dome having a diameter substantially equal to the diameter of the rotor hub and positioned above said fan.

11. A heat sink according to claim 1, wherein the lower portion of the conducting plate comprises at least a heat anvil.

* * * * *